United States Patent
Kim et al.

(10) Patent No.: US 7,750,472 B2
(45) Date of Patent: Jul. 6, 2010

(54) DUAL METAL INTERCONNECTION

(75) Inventors: Heong Jin Kim, Gyeongbuk (KR); Sung Jin Kim, Busan (KR)

(73) Assignee: Dongbu HiTek Co., Ltd., Seoul (KR)

( * ) Notice: Subject to any disclaimer, the term of this patent is extended or adjusted under 35 U.S.C. 154(b) by 733 days.

(21) Appl. No.: 11/617,366

(22) Filed: Dec. 28, 2006

(65) Prior Publication Data

US 2007/0164436 A1 Jul. 19, 2007

(30) Foreign Application Priority Data

Dec. 29, 2005 (KR) .................. 10-2005-0134124

(51) Int. Cl.
*H01L 21/00* (2006.01)
(52) U.S. Cl. .................. 257/758; 257/773; 257/774
(58) Field of Classification Search .......... 257/758, 257/773–774
See application file for complete search history.

(56) References Cited

U.S. PATENT DOCUMENTS

| | | | | | |
|---|---|---|---|---|---|
| 5,374,572 | A | * | 12/1994 | Roth et al. | 438/156 |
| 5,814,868 | A | * | 9/1998 | Roth et al. | 257/393 |
| 6,249,018 | B1 | * | 6/2001 | Liaw et al. | 257/303 |
| 6,359,328 | B1 | * | 3/2002 | Dubin | 257/622 |
| 6,933,230 | B2 | * | 8/2005 | Dubin | 438/660 |
| 7,119,389 | B2 | * | 10/2006 | Lee et al. | 257/298 |
| 7,321,146 | B2 | * | 1/2008 | Yun et al. | 257/300 |
| 7,442,637 | B2 | * | 10/2008 | Su et al. | 438/624 |
| 7,495,292 | B2 | * | 2/2009 | Oh et al. | 257/379 |
| 7,504,295 | B2 | * | 3/2009 | Lee et al. | 438/232 |
| 2002/0094673 | A1 | * | 7/2002 | Dubin | 438/626 |
| 2004/0238963 | A1 | * | 12/2004 | Fujisawa | 257/758 |
| 2005/0127347 | A1 | * | 6/2005 | Choi et al. | 257/2 |
| 2005/0250316 | A1 | * | 11/2005 | Choi et al. | 438/637 |
| 2006/0033215 | A1 | * | 2/2006 | Blanchet et al. | 257/774 |
| 2006/0194348 | A1 | * | 8/2006 | Araujo et al. | 438/3 |
| 2007/0126029 | A1 | * | 6/2007 | Kim | 257/209 |
| 2007/0126051 | A1 | * | 6/2007 | Kanegae | 257/316 |
| 2007/0145485 | A1 | * | 6/2007 | Oh et al. | 257/363 |
| 2007/0164436 | A1 | * | 7/2007 | Kim et al. | 257/758 |
| 2007/0241380 | A1 | * | 10/2007 | Hasunuma | 257/296 |
| 2008/0048339 | A1 | * | 2/2008 | Ahn et al. | 257/774 |
| 2008/0067554 | A1 | * | 3/2008 | Jeong et al. | 257/211 |
| 2008/0073635 | A1 | * | 3/2008 | Kiyotoshi et al. | 257/2 |
| 2008/0242024 | A1 | * | 10/2008 | Sugioka | 438/259 |
| 2009/0065944 | A1 | * | 3/2009 | Shih | 257/773 |

* cited by examiner

*Primary Examiner*—Laura M Menz
(74) *Attorney, Agent, or Firm*—Sherr & Vaughn, PLLC

(57) ABSTRACT

Embodiments relate to a dual metal interconnection structure of a semiconductor device and a method for manufacturing the same. In embodiments, the dual metal interconnection structure may include a contact plug selectively formed in an interlayer dielectric, which covers a silicon substrate, and contacted with an active area of the silicon substrate, a first aluminum interconnection formed on one contact plug in every two cells and having a width larger than a width of the contact plug, a dielectric wrapping an upper surface and a side plane of the first aluminum interconnection, and a second aluminum interconnection formed on one contact plug in every two cells alternatively with the first aluminum interconnection, insulated from the first aluminum interconnection by the dielectric, and having a width larger than a width of the contact plug. The dual metal interconnection structure may be formed by performing an interconnection process two times, and a width of the interconnection and a gap between interconnections may be increased.

7 Claims, 3 Drawing Sheets

DUAL METAL INTERCONNECTION

The present application claims priority under 35 U.S.C. 119 and 35 U.S.C. 365 to Korean Patent Application No. 10-2005-0134124 (filed on Dec. 29, 2005), which is hereby incorporated by reference in its entirety.

BACKGROUND

A semiconductor memory element, such as a flash memory, may include excellent sensing characteristics, and may have a low bit line resistance. A lower resistance of an interconnection may improve process coverage in a design by increasing the signal process speed and improving the sensing margin.

As semiconductor techniques develop, a size of cells may be reduced. However, a resistance of the interconnection may limit how small a cell size can be reduced. Accordingly it may be important to improve the resistance of the interconnection.

Copper may be used as an interconnection material in an effort to improve the resistance. Since a copper interconnection may have a low specific resistance as compared to an aluminum interconnection, the copper interconnection may be effective to solve a resistance problem of interconnections.

However, since copper interconnection techniques may be more expensive, a product yield may be degraded if the copper interconnection technique is applied to memory products.

A related art metal interconnection structure is shown in FIG. 1.

Referring to FIG. 1, isolation layer 11, which may define an active area, may be formed on silicon substrate 10. Interlayer dielectric 12 may be formed on a surface (for example, the entire surface) of silicon substrate 10.

Contact plug 13, which may be in contact with the active area of silicon substrate 10, may be formed by selectively etching interlayer dielectric 12. Aluminum interconnection 14 may be formed on contact plug 13.

In the metal interconnection structure, since a margin of space may be small, it may be difficult to control a process. Accordingly a change of contact resistance may occur due to a misalignment between aluminum interconnection 14 and contact plug 13.

Moreover, since the metal interconnection structure may have a large aspect ratio due to a shallow gap between aluminum interconnection 14, a void may be caused by not filling the gap between aluminum interconnection 14 if an interlayer dielectric is deposited in a subsequent process.

This may affect a thickness of the interconnection. Accordingly, if a size of cells is reduced, a problem with the interconnection resistance may occur.

SUMMARY

Embodiments relate to a manufacturing technique of a semiconductor device. Embodiments relate to a dual metal interconnection and a method for manufacturing the same for increasing a gap and a width of the metal interconnection by forming one metal interconnection on every two cells twice.

Embodiments relate to a metal interconnection structure of a semiconductor device and a method for manufacturing the same that may be capable of solving a problem related to interconnection resistance, which may occur when size of cells is reduced, obtaining a sufficient process margin, and improving the gap-fill characteristics of an interlayer dielectric.

Embodiments relate to a dual metal interconnection structure and a method for manufacturing the same.

In embodiments, a dual metal interconnection structure may include a contact plug selectively formed in an interlayer dielectric, which covers a silicon substrate, and contacted with an active area of the silicon substrate, a first aluminum interconnection formed on one contact plug in every two cells and having a width larger than a width of the contact plug, a dielectric wrapping an upper surface and a side plane of the first aluminum interconnection, and a second aluminum interconnection formed on one contact plug in every two cells alternatively with the first aluminum interconnection, insulated with the first aluminum interconnection by the dielectric, and having a width larger than the contact plug.

In embodiments of a dual metal interconnection structure, a thickness of the second aluminum interconnection may be larger than the thickness of the first aluminum interconnection, in which the second aluminum interconnection may be partially overlapped with an upper surface of the first aluminum interconnection.

In embodiments of a dual metal interconnection structure, gaps between the first aluminum interconnections and the second aluminum interconnections may be larger than a gap between the contact plugs.

In embodiments a method for manufacturing a dual metal interconnection structure may include a) selectively etching an interlayer dielectric which covers a silicon substrate and forming a contact plug contacted with an active area of the silicon substrate, b) forming a first aluminum interconnection, which may be positioned on one contact plug in every two cells and having a width larger than the contact plug, and a cap dielectric positioned on an upper surface of the first aluminum interconnection by sequentially depositing and selectively etching the first aluminum interconnection and the first dielectric, c) forming a spacer dielectric on both sides of the first aluminum interconnection and the cap dielectric by depositing the second dielectric and performing an etch-back process, and d) forming a second aluminum interconnection formed on one contact plug in every two cells alternatively with the first aluminum interconnection, insulated with the first aluminum interconnection by the cap dielectric and the spacer dielectric and having a width larger than a width of the contact plug.

In embodiments, the second aluminum interconnection may be selectively etched so that the second aluminum interconnection may be deposited thicker than the first aluminum interconnection and may be partially overlapped with an upper surface of the first aluminum.

DETAILED DESCRIPTION OF EMBODIMENTS

FIGS. 2a to 2d are example cross section views showing a dual metal interconnection structure of a semiconductor device and a method for manufacturing the same in accordance with embodiments.

Figure 1:
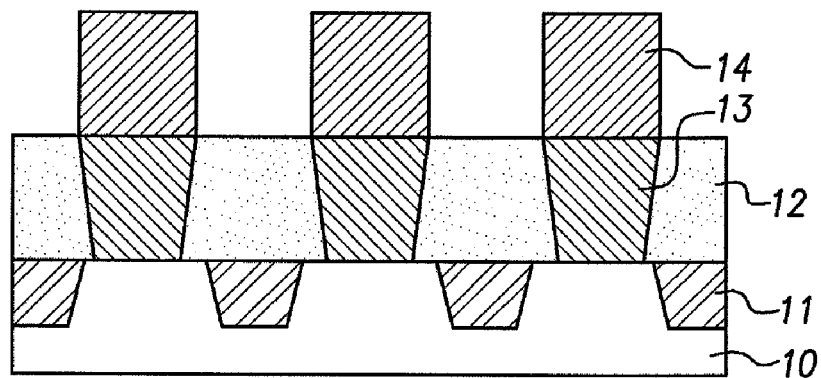
FIG. 1 is an example cross section diagram illustrating a related art metal interconnection structure of a semiconductor device.
Figure 2A:
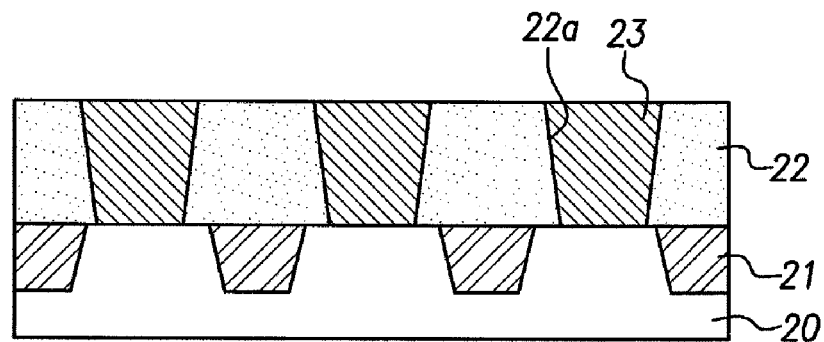
FIGS. 2a to 2d are example cross section diagrams illustrating a dual metal interconnection structure of a semiconductor device and a method for manufacturing the same in accordance embodiments.

Referring to FIG. 2a, isolation layer 21, which may define an active area, may be formed on silicon substrate 20. Isolation layer 21 may be a shallow trench isolation (STI) silicon dioxide film.

Interlayer dielectric 22 may be deposited on a surface (for example, the entire surface) of silicon substrate 20. Contact hole 22a may then be formed by selectively etching interlayer dielectric 22, and the active area of silicon substrate 20 may be exposed.

Contact plug 23 may be formed within contact hole 22a, for example by depositing a barrier metal and a tungsten (W) on a surface (for example, the entire surface) of a resultant structure. Contact plug 23 may be planarized, for example until interlayer dielectric 22 is exposed.

Figure 2B:
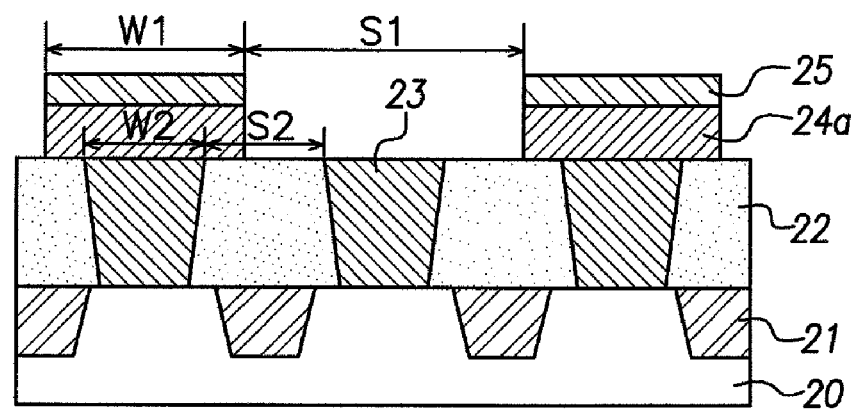

Referring to FIG. 2b, first aluminum interconnection 24a and cap dielectric 25 positioned on an upper surface of first aluminum interconnection 24a may be formed, for example by sequentially depositing a first aluminum layer and a first dielectric and then and performing a photolithography process.

Although not illustrated in drawings, a barrier metal layer, such as a titanium/titanium nitrite layer, may be formed on an upper/lower portion of first aluminum interconnection 24a.

First aluminum interconnection 24a may be formed to be connected with one contact plug for every two cells (i.e. connected with every other contact plug).

Width W1 of first aluminum interconnection 24a may be larger than width W2 of contact plug 23.

A width of cap dielectric 25 may be the same as width W1 of first aluminum interconnection 24a.

Gap S1 between first aluminum interconnections 24 may be larger than gap S2 between contact plugs 23.

Figure 2C:
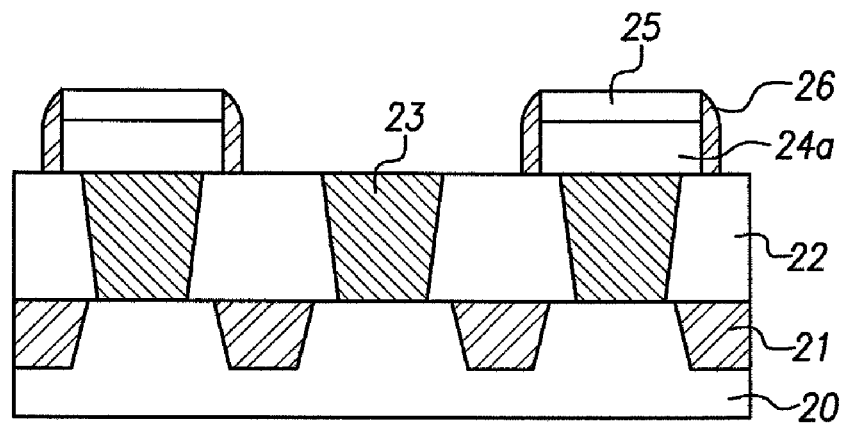

Referring to FIG. 2c, a spacer dielectric may be formed on both sides of first aluminum interconnection 24a and cap dielectric 25, for example by depositing the second dielectric and performing an etch-back process.

First aluminum interconnection 24a may thus be surrounded by cap dielectric 25 and spacer dielectric 26.

Figure 2D:
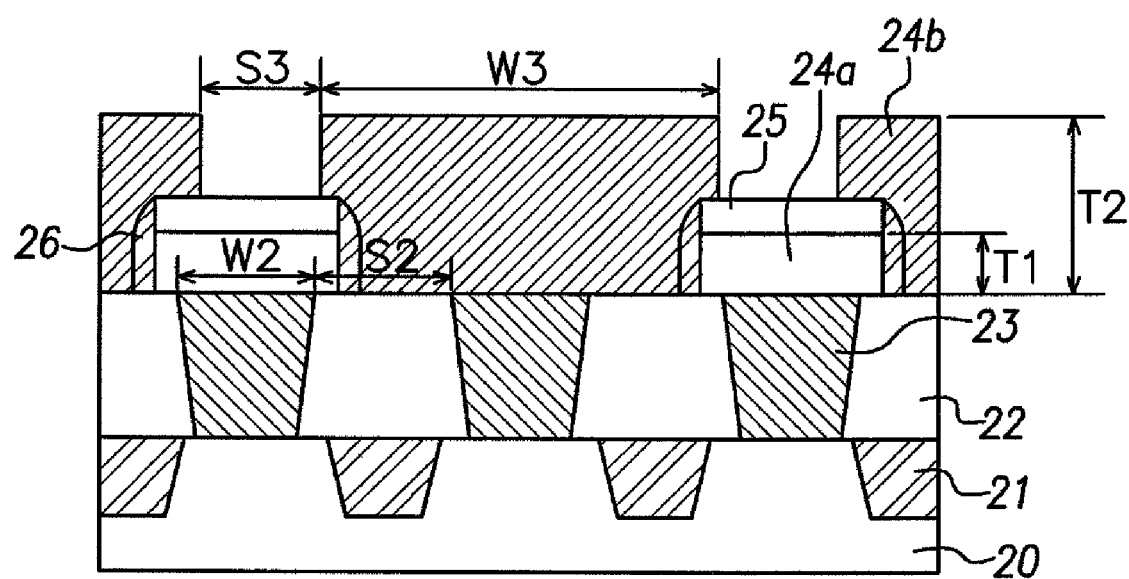

Referring to FIG. 2d, second aluminum interconnection 24b may be formed by depositing a second aluminum layer on a surface (for example, the entire surface) of the resultant structure.

Second aluminum interconnection 24b may be electrically insulated from first aluminum interconnection 24a by cap dielectric 25 and spacer dielectric 26.

Although not illustrated, a barrier metal layer, such as a titanium/titanium nitrite layer, may be formed on an upper/lower portion of second aluminum interconnection 24b.

Second aluminum interconnection 24b may be formed, and may be connected with one contact plug 23 in every two cells, and may be alternatively formed with first aluminum interconnection 24a.

Thickness T2 of second aluminum interconnection 24b may be larger than thickness T1 of first aluminum interconnection 24a.

Thickness T1 and T2 of first and second aluminum interconnections 24a and 24b may be adjusted to have the same resistance.

Width W3 of second aluminum interconnection 24b may be larger than width W2 of contact plug 23.

Moreover, gap S3 between second aluminum interconnections 24a may be larger than a gap between contact plugs 23.

According to embodiments, a metal interconnection structure may be formed on every two cells by performing two interconnection processes.

Cap dielectric 25 and spacer dielectric 26, which may be an electrical dielectric material, may be formed between first aluminum interconnection 24a and second aluminum interconnection 24b. Second aluminum interconnection 24b may be formed thicker than first aluminum interconnection 24a and may partially overlap an upper surface of first aluminum interconnection 24a.

First and second aluminum interconnections 24a and 24b may have a larger width and gap than contact plug 23.

That is, as compared with a related art metal interconnection which may have nearly the same width and gap as the contact plug, the dual layers structure of embodiments may have an increased width and gap.

Accordingly, in a dual layer structure of embodiments, since a space margin increases between layers, it may be easy to control the process. Since an aspect ratio between layers may be improved, the filling in a deposition process of an interlayer dielectric may improve and an occurrence of a void may be prevented.

Moreover, since a width of an interconnection may be increased, a resistance of the interconnection may be reduced and the interconnection may be flexibly used even if a size of a cell is reduced.

In addition, a wide width of the interconnection may prevent a contact resistance from changing due to a misalignment between the interconnection and the contact by obtaining an enough contact margin. Since the thickness of the interconnection may be reduced due to the wide width of the interconnection, a thickness of a photosensitive film may be reduced in a photo process.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A device comprising:
   a plurality of contact plugs formed in an interlayer dielectric covering a silicon substrate, each contact plug configured to be in electrical contact with an active area of the silicon substrate;
   a first aluminum interconnection formed over a first contact plug and having a width larger than a width of the first contact plug;
   a dielectric covering an upper surface and a side surface of the first aluminum interconnection;
   a second aluminum interconnection formed over a second contact plug adjacent to the first contact plug, and further formed over at least a portion of the first aluminum interconnection, insulated from the first aluminum interconnection by the dielectric, and having a width larger than a width of the second contact plug;
   a plurality of first aluminum interconnections formed over a plurality of first alternating contact plugs, wherein one first aluminum interconnection is formed for every two alternating contact plugs; and
   a plurality of second aluminum interconnections formed over a plurality of second alternating contact plugs, each of the plurality of first alternating contact plugs being between each of the plurality of second alternating contact plugs in an alternating pattern.

2. The device of claim 1, wherein a gap between first aluminum interconnections is greater than a gap between first and second contact plugs.

3. The device of claim 2, wherein a gap between the second aluminum interconnections is greater than a gap between the first and second contact plugs.

4. A device comprising:
a plurality of contact plugs formed in an interlayer dielectric covering a silicon substrate, each contact plug configured to be in electrical contact with an active area of the silicon substrate;
a first aluminum interconnection formed over a first contact plug and having a width larger than a width of the first contact plug;
a dielectric covering an upper surface and a side surface of the first aluminum interconnection;
a second aluminum interconnection formed over a second contact plug adjacent to the first contact plug, and further formed over at least a portion of the first aluminum interconnection, insulated from the first aluminum interconnection by the dielectric, and having a width larger than a width of the second contact plug; and
a third aluminum interconnection formed over a third contact plug adjacent to the second contact plug, having a width larger than a width of the third contact plug, and a second dielectric formed over an upper surface and a side surface of the third aluminum interconnection, wherein a size of the third aluminum interconnection is substantially identical to a size of the first aluminum interconnection, and wherein the second aluminum interconnection is formed over at least a portion of the third aluminum interconnection, insulated from the third aluminum interconnection by the second dielectric.

5. The device of claim 1, wherein a thickness of the second aluminum interconnection is greater than a thickness of the first aluminum interconnection.

6. The device of claim 5, wherein the second aluminum interconnection partially overlaps an upper surface of the first aluminum interconnection.

7. The device of claim 1, wherein a gap between the first aluminum interconnections and the second aluminum interconnections is larger than a gap between the first and second contact plugs.

* * * * *